US008897016B2

(12) United States Patent
Degner et al.

(10) Patent No.: US 8,897,016 B2
(45) Date of Patent: Nov. 25, 2014

(54) HEAT REMOVAL IN COMPACT COMPUTING SYSTEMS

(71) Applicant: Apple Inc., Cupertino, CA (US)

(72) Inventors: Brett W. Degner, Menlo Park, CA (US); Peteris K. Augenbergs, San Francisco, CA (US); Frank Liang, San Jose, CA (US); Amaury J. Heresztyn, Cupertino, CA (US); Dinesh Mathew, Fremont, CA (US); Thomas W. Wilson, Saratoga, CA (US)

(*) Notice: Subject to any disclaimer, the term of this patent is extended or adjusted under 35 U.S.C. 154(b) by 0 days.

(21) Appl. No.: 13/633,823

(22) Filed: Oct. 2, 2012

(65) Prior Publication Data

US 2013/0094141 A1 Apr. 18, 2013

Related U.S. Application Data

(63) Continuation of application No. 12/620,299, filed on Nov. 17, 2009, now Pat. No. 8,305,761.

(51) Int. Cl.
| | |
|---|---|
| *H05K 7/20* | (2006.01) |
| *H05K 5/00* | (2006.01) |
| *H01L 23/10* | (2006.01) |
| *G06F 1/20* | (2006.01) |
| *F28F 7/00* | (2006.01) |
| *F28F 1/00* | (2006.01) |
| *H01L 23/40* | (2006.01) |
| *B23P 15/26* | (2006.01) |
| *H01L 23/427* | (2006.01) |

(52) U.S. Cl.
CPC .............. *G06F 1/203* (2013.01); *H05K 7/2039* (2013.01); *F28F 1/00* (2013.01); *H01L 2924/3011* (2013.01); *H01L 23/4006* (2013.01); *B23P 15/26* (2013.01); *H01L 23/427* (2013.01)
USPC ........... 361/719; 361/717; 361/720; 361/718; 361/679.54; 361/702; 361/704; 361/679.53; 361/679.52; 361/709; 361/711; 165/80.2; 165/104.33; 174/15.2; 257/675; 257/706; 257/713

(58) Field of Classification Search
CPC ............ H01L 23/4093; H01L 23/4006; H01L 23/467; H01L 23/3672; H01L 23/473; H01L 23/4334; H01L 2023/405; H01L 2924/14; H01L 2924/01079; G06F 1/20; H05K 1/0206; F28D 15/0233
USPC ................. 361/717–720, 702, 704, 709, 711, 361/679.52–679.54; 165/104.33, 80.2; 174/15.2; 257/706, 675, 713
See application file for complete search history.

(56) References Cited

U.S. PATENT DOCUMENTS

| | | | | |
|---|---|---|---|---|
| 5,367,193 | A * | 11/1994 | Malladi .......................... | 257/707 |
| 5,608,267 | A * | 3/1997 | Mahulikar et al. ............ | 257/796 |
| 5,720,339 | A | 2/1998 | Glass et al. | |
| 5,933,326 | A * | 8/1999 | Lee et al. ....................... | 361/704 |
| 5,960,866 | A | 10/1999 | Kimura et al. | |
| 6,122,169 | A * | 9/2000 | Liu et al. ....................... | 361/700 |
| 6,146,921 | A * | 11/2000 | Barrow .......................... | 438/122 |
| 6,184,578 | B1 | 2/2001 | Gardner et al. | |

(Continued)

*Primary Examiner* — Bradley Thomas
(74) *Attorney, Agent, or Firm* — Womble Carlyle Sandridge & Rice LLP

(57) ABSTRACT

A low profile heat removal system suitable for removing excess heat generated by a component operating in a compact computing environment is disclosed.

20 Claims, 12 Drawing Sheets

600

(56) References Cited

U.S. PATENT DOCUMENTS

| | | |
|---|---|---|
| 6,328,097 B1 | 12/2001 | Bookhardt et al. |
| 6,373,700 B1 | 4/2002 | Wang |
| 6,442,026 B2 | 8/2002 | Yamaoka |
| 6,545,352 B1 | 4/2003 | Ruckdeschel |
| 6,859,368 B2 | 2/2005 | Yang |
| 6,865,082 B2 | 3/2005 | Huang et al. |
| 6,882,535 B2* | 4/2005 | Labanok et al. .............. 361/704 |
| 6,894,908 B1 | 5/2005 | Clark et al. |
| 6,937,474 B2* | 8/2005 | Lee ............................. 361/715 |
| 6,942,016 B2 | 9/2005 | Kobayashi et al. |
| 7,057,897 B2 | 6/2006 | Leu |
| 7,124,807 B2* | 10/2006 | Chang ......................... 165/80.3 |
| 7,232,332 B2 | 6/2007 | Osborn et al. |
| 7,274,572 B2 | 9/2007 | Wang et al. |
| 7,436,673 B2 | 10/2008 | Wang et al. |
| 7,511,956 B2* | 3/2009 | Tomioka et al. .............. 361/697 |
| 7,515,426 B2 | 4/2009 | Depew |
| 7,568,517 B2* | 8/2009 | Hwang et al. ................ 165/80.2 |
| 7,688,587 B2 | 3/2010 | Ishikawa |
| 7,697,288 B2 | 4/2010 | Okutsu |
| 7,714,423 B2 | 5/2010 | Reid et al. |
| 7,746,647 B2* | 6/2010 | Guo et al. ..................... 361/710 |
| 7,764,504 B2* | 7/2010 | Phillips et al. ................ 361/715 |
| 7,766,691 B2 | 8/2010 | Pandey et al. |
| 2001/0002160 A1* | 5/2001 | Bookhardt et al. ........... 361/704 |
| 2001/0040300 A1* | 11/2001 | Huang et al. .................. 257/787 |
| 2003/0051868 A1* | 3/2003 | Dishongh et al. ............. 165/185 |
| 2003/0196787 A1* | 10/2003 | Mahoney ....................... 165/274 |
| 2004/0132331 A1* | 7/2004 | Osborn et al. ................. 439/485 |
| 2004/0190259 A1* | 9/2004 | Labanok et al. .............. 361/704 |
| 2005/0036292 A1* | 2/2005 | Chengalva et al. ........... 361/715 |
| 2005/0174739 A1* | 8/2005 | Chen et al. .................... 361/704 |
| 2006/0071308 A1* | 4/2006 | Tang et al. .................... 257/675 |
| 2006/0097381 A1* | 5/2006 | Akram .......................... 257/706 |
| 2006/0103008 A1* | 5/2006 | Ong et al. ...................... 257/706 |
| 2006/0131735 A1* | 6/2006 | Ong et al. ...................... 257/706 |
| 2007/0121291 A1 | 5/2007 | Wang et al. |
| 2007/0171616 A1* | 7/2007 | Peng et al. .................... 361/700 |
| 2008/0130231 A1* | 6/2008 | Chen ............................. 361/701 |
| 2008/0142196 A1 | 6/2008 | Jeng |
| 2008/0180915 A1 | 7/2008 | Lin |
| 2008/0198551 A1* | 8/2008 | Hoss et al. .................... 361/702 |
| 2008/0212289 A1 | 9/2008 | Lin |
| 2009/0020268 A1 | 1/2009 | Chang et al. |
| 2009/0046426 A1* | 2/2009 | Ishikawa ....................... 361/695 |
| 2009/0103262 A1* | 4/2009 | Hata ............................. 361/689 |
| 2009/0142956 A1 | 6/2009 | Ma |
| 2010/0177477 A1 | 7/2010 | Cheng et al. |
| 2010/0238631 A1 | 9/2010 | Kuo et al. |

* cited by examiner

HEAT REMOVAL IN COMPACT COMPUTING SYSTEMS

CROSS REFERENCE TO RELATED APPLICATIONS

This application claims priority under 35 USC §120 to U.S. Nonprovisional patent application Ser. No. 12/620,299, filed Nov. 17, 2009, entitled "HEAT REMOVAL IN COMPACT COMPUTING SYSTEMS" which is incorporated by reference herein in its entirety and for all purposes.

BACKGROUND OF THE INVENTION

1. Field of the Invention

This invention relates generally to small computing devices such as laptop computers and in particular, providing a heat removal system that is efficient in both space and heat removal.

2. Description of the Related Art

Compact computing devices such as laptop computers, netbook computers, etc. have become ever smaller, lighter and more powerful. One factor contributing to this reduction in size can be attributed to the manufacturer's ability to fabricate various components of these devices in smaller and smaller sizes, assembling the components in ever more dense configurations, and in most cases increasing the power and or operating speed of such components. As processor power and speed has increased, however, so too has the excess heat generated. As the density of the internal components has increased, the ability to efficiently remove the excess heat generated by those operating components having a high heat flux has been become ever more difficult and costly.

A heat pipe is a heat transfer mechanism that can transport large quantities of heat with a very small difference in temperature between the hotter and colder interfaces and is therefore well suited for use in laptop computers, and other high density, compact computing environments. A typical heat pipe consists of a sealed pipe or tube made of a material with high thermal conductivity such as copper or aluminum. The heat pipe includes a working fluid, (or coolant), chosen to match the operating temperature of the compact computing device. Some example fluids are water, ethanol, acetone, sodium, or mercury. (Clearly, due to the benign nature and excellent thermal characteristics, water is used as the working fluid in consumer products such as laptop computers.) Inside the heat pipe's walls, an optional wick structure exerts a capillary pressure on the liquid phase of the working fluid. The wick structure is typically a sintered metal powder or a series of grooves parallel to the heat pipe axis, but it may be any material capable of exerting capillary pressure on the condensed liquid to wick it back to the heated end. It should be noted, however, that the heat pipe may not need a wick structure if gravity or some other source of acceleration is sufficient to overcome surface tension and cause the condensed liquid to flow back to the heated end.

Space or volume is at a premium in compact computer environments and it is essential that any heat removal system must be able to maximize heat transfer while minimizing the space occupied. In addition to minimizing the space required, it is desirable that the heat removal system be relatively inexpensive to fabricate. The cost of fabrication is relatively high when the heat removal system is fabricated from especially dedicated and unique components as distinguished from being fabricated from stock materials.

Although the prior art effectively dissipates heat from electronic devices, there is a continuing need for alternative designs that do not substantially add additional height to the existing Z stack height, that effectively dissipate heat and are relatively inexpensive to fabricate.

SUMMARY OF THE DESCRIBED EMBODIMENTS

The invention relates to systems, methods, and apparatus for efficiently removing heat from components in a compact computing system such as a laptop or netbook computer.

In one embodiment, a compact computer heat removal system used for removing heat generated by an integrated circuit is described. In the described embodiment, the integrated circuit is mounted to a substrate that in turn is mounted to a motherboard. The heat removal system includes at least a heat pipe in thermal contact with the integrated circuit, the heat pipe is arranged to carry a heat exchanging medium that is used to transfer heat generated by the integrated circuit to an external heat sink in thermal contact with the heat pipe. The heat removal system also includes a reduced thickness integrated beam spring structure having a substantially uniform thickness used to mechanically couple the heat pipe to the motherboard. The reduced thickness of the beam structure commensurably reduces the height of the heat removal system that in turn reduces the overall integrated circuit stack height.

A compact computer heat removal system used for removing heat generated by an integrated circuit where the integrated circuit is mounted to a substrate that, in turn, is mounted to a motherboard. The compact computer heat removal system includes at least a slug in direct contact with a surface of the integrated surface. A heat pipe in thermal contact with the integrated circuit by way of the slug is used to provide support for the heat pipe and to provide a thermal conduction path between the integrated circuit and the heat pipe. In the described embodiment, the heat pipe carries a heat exchanging medium used to transfer heat generated by the integrated circuit to an external heat sink in thermal contact with the heat pipe. The compact computer heat removal system also includes a windowed stage having an opening arranged to accommodate the slug. The windowed stage is mechanically connected to the motherboard by way of fasteners. By accommodating the slug within the opening, the windowed stage reduces the thickness of the heat removal system that commensurably reduces an overall integrated circuit stack height.

In yet another embodiment, a heat removal system suitably configured to transfer heat generated by an operating component in a compact computer to the external environment is described. The heat removal system includes at least a heat pipe positioned in direct thermal contact with the operational component, at least one lateral winglet integrally formed with and of substantially the same material as the heat pipe, an upper surface of the winglet being substantially flush with a lower surface of the heat pipe such that substantially all of the at least one winglet extends below the lower surface of the heat pipe, the upper surface extending laterally out from the heat pipe to form a supporting surface, and a stage portion having a first end, the first end having a lower surface supported by the supporting surface such that an upper surface of the stage portion is substantially flush with an upper surface of the heat pipe.

In still another embodiment, a method for removing heat generated by an integrated circuit is described where the integrated circuit is mounted to a substrate, the substrate mounted to a motherboard. The method can be carried out by performing at least the following operations: providing a heat pipe in thermal contact with the integrated circuit, the heat pipe arranged to carry a heat exchanging medium that is used to transfer heat received from the integrated circuit to a heat sink, and using a reduced thickness integrated beam spring structure to mechanically couple the heat pipe to the motherboard. In the described embodiment, the reduced thickness of the beam structure reduces an overall integrated circuit stack height.

A method for removing heat generated by an integrated circuit is described. In the described embodiment, the integrated circuit is mounted to a substrate that in turn is mounted to a motherboard. The method can be carried out by performing at least the following operations. Providing a slug in direct contact with a surface of the integrated surface, providing a heat pipe in thermal contact with the integrated circuit by way of the slug, the slug being used to provide support for the heat pipe and to provide a thermal conduction path between the integrated circuit and the heat pipe, providing a windowed stage having an opening arranged to accommodate the slug, the windowed stage being mechanically connected to the motherboard by way of fasteners. The heat removal system thickness is commensurably reduced by the windowed stage accommodating the slug within the opening.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF SELECTED EMBODIMENTS

Figure 1:
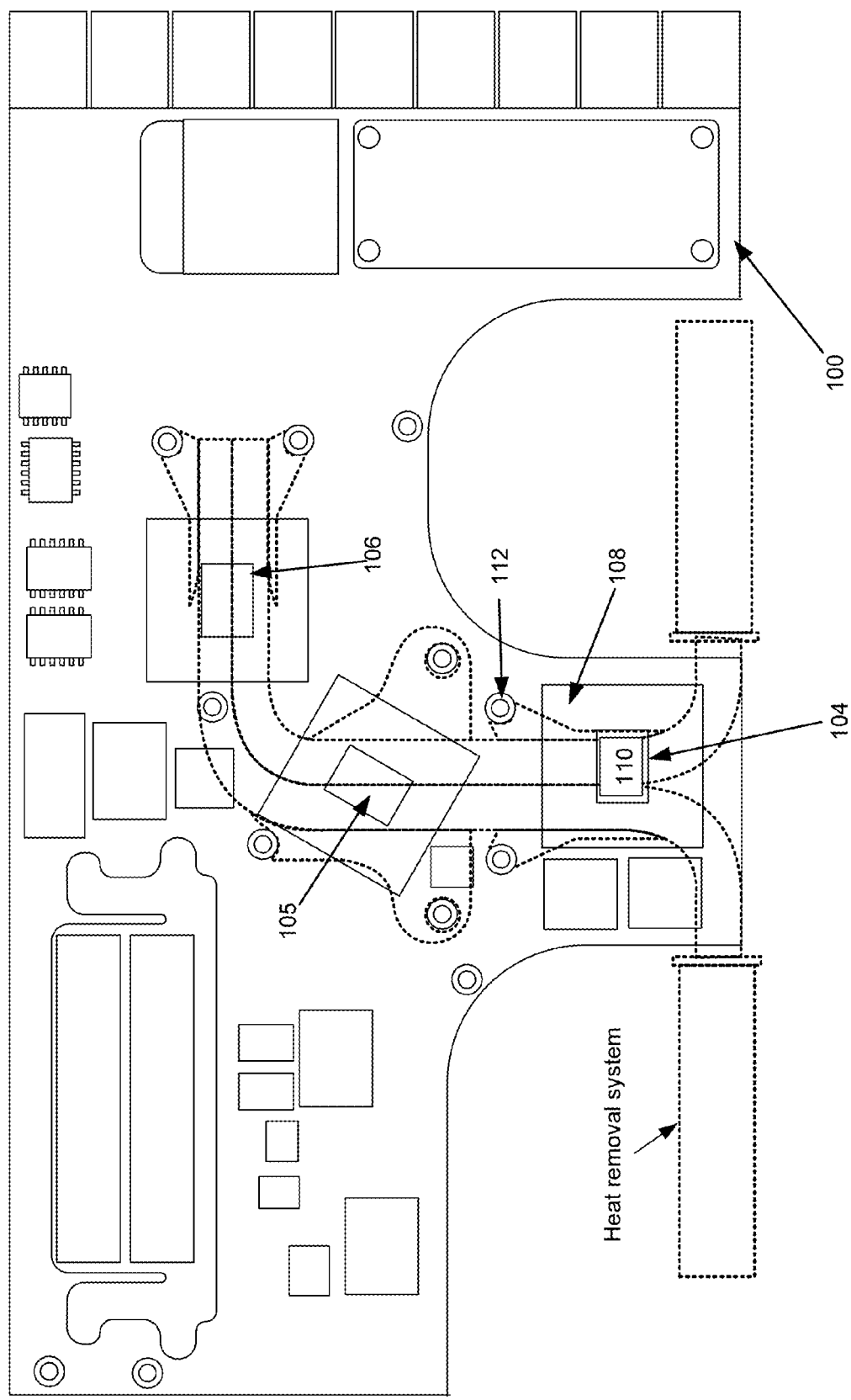
FIG. 1 is a view of a representative motherboard found in a small computer, such as a laptop and a cross sectional view of a portion of the motherboard.

Reference will now be made in detail to selected embodiments an example of which is illustrated in the accompanying drawings. While the invention will be described in conjunction with a preferred embodiment, it will be understood that it is not intended to limit the invention to one preferred embodiment. To the contrary, it is intended to cover alternatives, modifications, and equivalents as can be included within the spirit and scope of the invention as defined by the appended claims.

The described embodiments relate to an efficient, reduced profile heat removal system well suited for use in compact computing systems such as laptop computers, netbooks, etc. In the described embodiments, the compact heat removal system can include a heat pipe. A heat pipe is a simple device adapted to quickly transfer heat from one point to another. The heat pipe itself includes a sealed aluminum or copper container having inner surfaces formed of capillary wicking material. The heat pipe can transport heat against gravity by an evaporation-condensation cycle with the help of porous capillaries that can provide the wicking action in the form of a capillary driving force to return the condensate to the evaporator. The heat pipe is well suited for use in compact computing systems that require efficient transfer of heat from various components such as a CPU, graphics processor, and so on. The heat pipe can be generally light weight and have a small compact profile. Moreover, its passive operation makes it particularly useful in small computing systems, such as laptop computers.

Heat pipes remove heat from the source in a two-phase process. As heat is generated, a liquid at one end of the pipe evaporates and releases the heat to a heat sink by condensation at the other end. The liquid is returned to start the process over through a wick structure on the inside of the heat pipe. Heat pipes passively transfer heat from the heat source to a heat sink where the heat is dissipated. The heat pipe itself is a vacuum-tight vessel that is evacuated and partially filled with a minute amount of water or other working fluid. As heat is directed into the device, the fluid is vaporized creating a pressure gradient in the pipe. This forces the vapor to flow along the pipe to the cooler section where it condenses, giving up its latent heat of vaporization. The working fluid is then returned to the evaporator by capillary forces developed in the heat pipe's porous wick structure, or by gravity.

The following description enumerates several embodiments of heat removal systems well suited for compact computing environments such as laptop computers. Throughout the description reference is made to Z stack and Z stack height. A Z stack can be interpreted to mean those components incorporated onto a motherboard of the laptop computer that are located within the footprint of an operational component (such as the central processing unit, or CPU). These components can be "stacked" one atop the other in the Z direction (i.e., Z stack) measured in the Z direction to have a Z stack height. For example, a CPU stack can include a motherboard, a substrate mounted to the motherboard, the CPU mounted to the substrate, and a heat removal system for removing excess heat from the CPU. In computing systems that have a thin profile, such as a laptop, it would clearly be advantageous for the CPU stack (in this example) to have as minimal height as possible. Therefore, providing a heat removal system that minimizes any addition to the Z stack height is preferred.

Accordingly, the various heat removal systems discussed herein each strive to add as little as possible to the Z stack height and yet provide efficient and/or increased heat removal. In some cases, however, a particular heat removal system may have reduced overall thermal efficiency but may nonetheless have a greater capacity to remove excess heat from the computing system. For example, some embodiments described herein provide for a heat pipe to be laterally placed next to an operational die (such as a central processing unit, or CPU) but also within the chip footprint. In these laterally placed configurations, heat primarily indirectly flows laterally from the CPU to the heat pipe through an intervening structure. This lateral heat flow can be inherently less efficient than those configurations with a direct heat flow path from CPU to heat pipe. However, since the heat pipe is place laterally next to the die, the heat pipe is no longer in the footprint of the die and can be considered outside of the Z stack. Therefore, the inherent loss of efficiency due to the lateral placement of the heat pipe can be more than offset by enlarging the cross section of the heat pipe without adding to the height of the Z stack. By enlarging the cross section, the per unit volume of working fluid in the heat pipe can be increased commensurably increasing the capability of the heat pipe to remove heat generated by the die.

Other embodiments rely upon integration of otherwise discrete components to reduce the Z stack height, improve thermal efficiency and reduce manufacturing costs by for example, reducing an overall parts count. For example, some embodiments described herein provide an integrated solution whereby various discrete components can be functionally replaced by a single integrated structure. This integrated structure can take the place of a discrete stage and slug. In some cases, the inherent flexibility of the integrated structure can act as a distributed spring system allowing for the removal of discrete springs that would otherwise be required.

In some embodiments, the heat pipes can be configured to provide a more robust thermal interface between the heat pipe and die. For example, a heat pipe can be configured to have wall with a varying thickness. In this way, only that portion of the heat pipe directly coupled with the thermal interface between heat pipe and die can have a greater wall thickness than other portions of the heat pipe. As a result, the thermal interface can be more rugged and the heat leaking out of the heat pipe into the local environment can be reduced without adding substantially to the Z stack height. In other embodiments, the heat pipe can be a composite heat pipe formed of multiple material layers having a least a first pipe wall at an outside diameter and a second pipe wall at an inside diameter where the first and second pipe walls can be formed of different materials depending upon the particular environment in which the heat pipe will be located.

Various embodiments of heat removal systems suitable for compact computing environments, such as laptop computers, are discussed below with reference to FIGS. 1-11. However, those skilled in the art will readily appreciate that the detailed description given herein with respect to these figures is for explanatory purposes as the full extent of the embodiments goes beyond these limited descriptions.

FIG. 1 shows a "bird's eye view" of representative mother board 100 in accordance with the described embodiments. In order to more clearly illustrate the various aspects of motherboard 100, a first view of motherboard 100 is shown without a heat removal system being physically present but nonetheless represented in dotted line form. Accordingly, motherboard 100 can include a number of components (such as processor die 104, graphics processing unit, or GPU, 105, and chip set 106) each of which can generate substantial heat while operating. Using processor die 104 as an example, processor die 104 is mounted to substrate 108 that in turn is mounted to motherboard 100. Viewed from above, slug 110 is seen mounted on top of processor die 104. Slug 110 can be formed of copper or any other thermally conductive material. Typically, in order to improve the thermal contact between processor die 104 and slug 110, thermally conductive material (sometimes referred to as thermal grease) can be applied to a top portion of processor die 104 prior to the placement of slug 110. In this way, the thermal resistance at the junction of processor die 104 and slug 110 can be reduced. By reducing the thermal resistance at the junction of slug 110 and processor die 104, a path of reduced resistance to heat flow can be formed such that heat will preferentially flow from processor die 104 to slug 110 and further to the heat removal system. Accordingly, a substantial portion of the heat generated by processor die 104 can flow to and through slug 110 as a primary heat flow. To a lesser extent, heat can flow from processor die 104 to motherboard 100 by way of substrate 108 as a secondary, less desirable, heat flow. Screw hole 112 (also referred to a boss) can be formed as part of motherboard 100 for use in receiving a securing screw or other appropriate fastener that can be used to secure the heat removal system or other components to motherboard 100.

Due to the compact nature of the computing environment (such as a laptop) in which motherboard 100 is intended to be placed, it is crucial that the overall height of the components, or Z stack, that are mounted to motherboard 100 be as small as possible. This is particularly true with regards to heat removal systems where a heat transfer apparatus, such as a heat pipe, must be in close thermal contact with heat generating components, such as the CPU. Therefore, it is essential for a good quality design that any incremental impact on Z stack height attributable to the heat removal system be minimized. This requirement for a "thin" heat removal system, however, must to be reconciled with the heat removal system being capable of transferring as much heat from the die as is reasonably possible.

Figure 2:
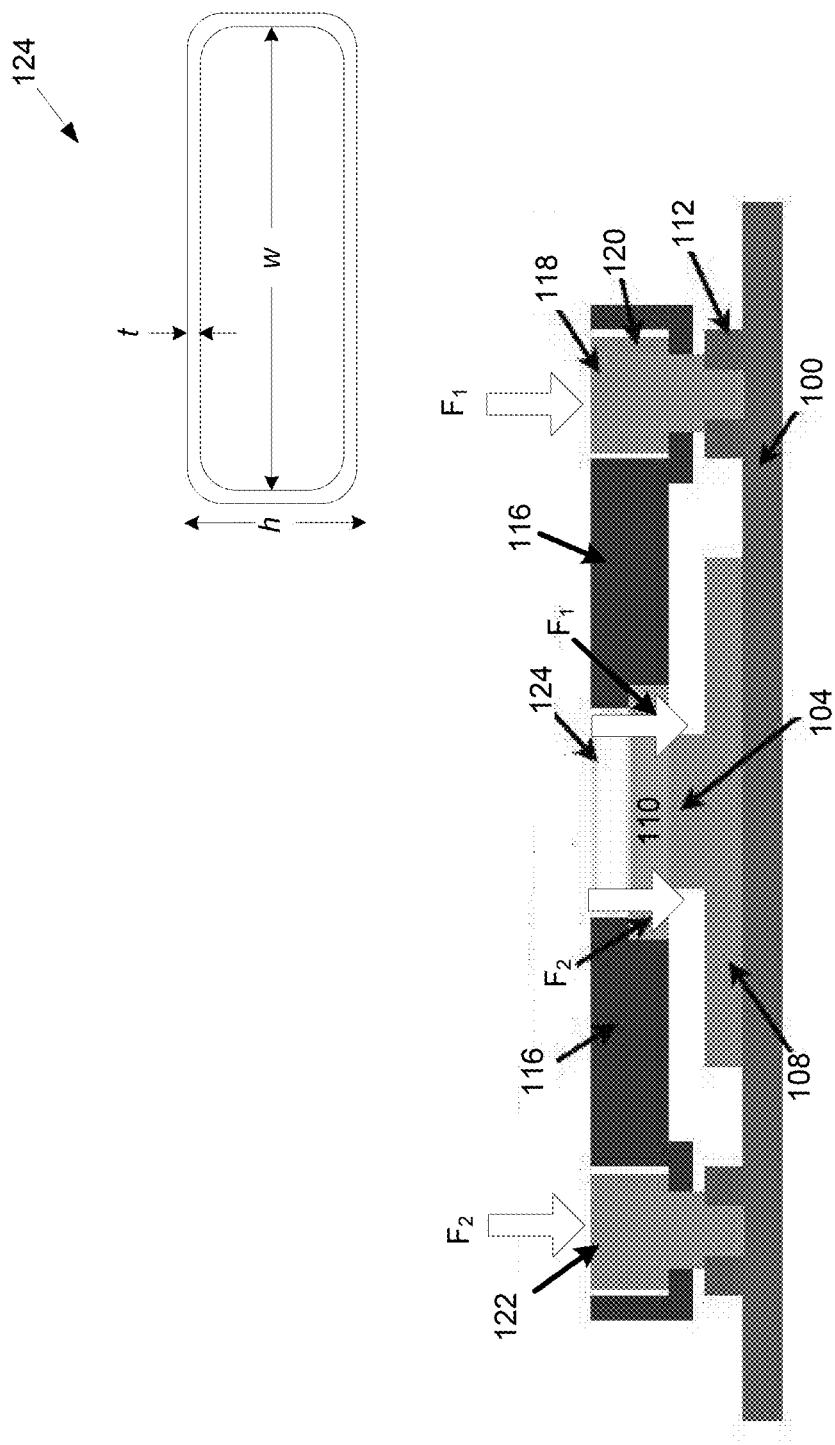
FIG. 2 shows a cross sectional view of motherboard at line A-A.

FIG. 2 shows a representative cross sectional view of motherboard 100. Boss 112 can receive a fastener assembly used to secure stage 116 to motherboard 100. The fastener assembly can include screw 118 and spring 120. By tightening screw 118, stage 116 can act as a beam and be used to apply force $F_1$ to slug 106. Moreover, by tightening screw 122 on an opposing side of stage 116, an additional force $F_2$ can be transmitted through stage 116 to slug 110 bringing the total force applied to slug 110 as $F_T$ (i.e., the sum of forces $F_1$ and $F_2$). When forces $F_1$ and $F_2$ are in balance, then the thermal interface between die 104 and slug 110 can be enhanced. In this way, any forces applied to stage 116 can be reflected in a change in the thermal transfer characteristics of the slug/die interface. This coupling of thermal transfer characteristics and applied force on the thermal interface is one factor that must be considered in the overall design of any heat removal system for compact computing systems.

Typically, stage 116 can have a nominal thickness of approximately 2-3 mm whereas slug 110 can have a nominal thickness of approximately 1 mm. In order for the heat removal system to not adversely impact Z stack height, a heat pipe should not extend above stage 116. In the case where a heat pipe has a circular shape, then the outside diameter (OD) of the circular heat pipe cannot be more than about 1-2 mm. However, the heat transfer capability of the heat pipe is dependent, in part, upon the transport volume of the working fluid that is in turn related to the $OD^2$ (more precisely the unit volume of working fluid is related to $\pi \times OD^2$) as well as the surface area of the circular heat pipe in contact with slug 110. Even though the circular heat pipe may be easy and cheap to produce, its heat transfer capability and therefore its usage is limited. However, a flattened, or low profile, heat pipe 124 having a rectangular cross section can be preferably used. Low profile heat pipe 124 has substantially greater working fluid volume per unit length as well as larger thermal interface with slug 116 than would a circular heat pipe having the same height. For example, low profile heat pipe 124 can have a constant wall thickness t, a nominal height h in the range of about 1-2 mm and width w of about 8-12 mm.

A variety of heat removal systems suitable for use in compact computing systems are illustrated in FIGS. 3-15. In addition to being compact, the described heat removal systems can be thermally efficient. It should be noted that due to the desirable characteristics both thermal and physical, unless otherwise stated, all heat pipes discussed hereinafter should be considered as being low profile heat pipes.

Figure 3:
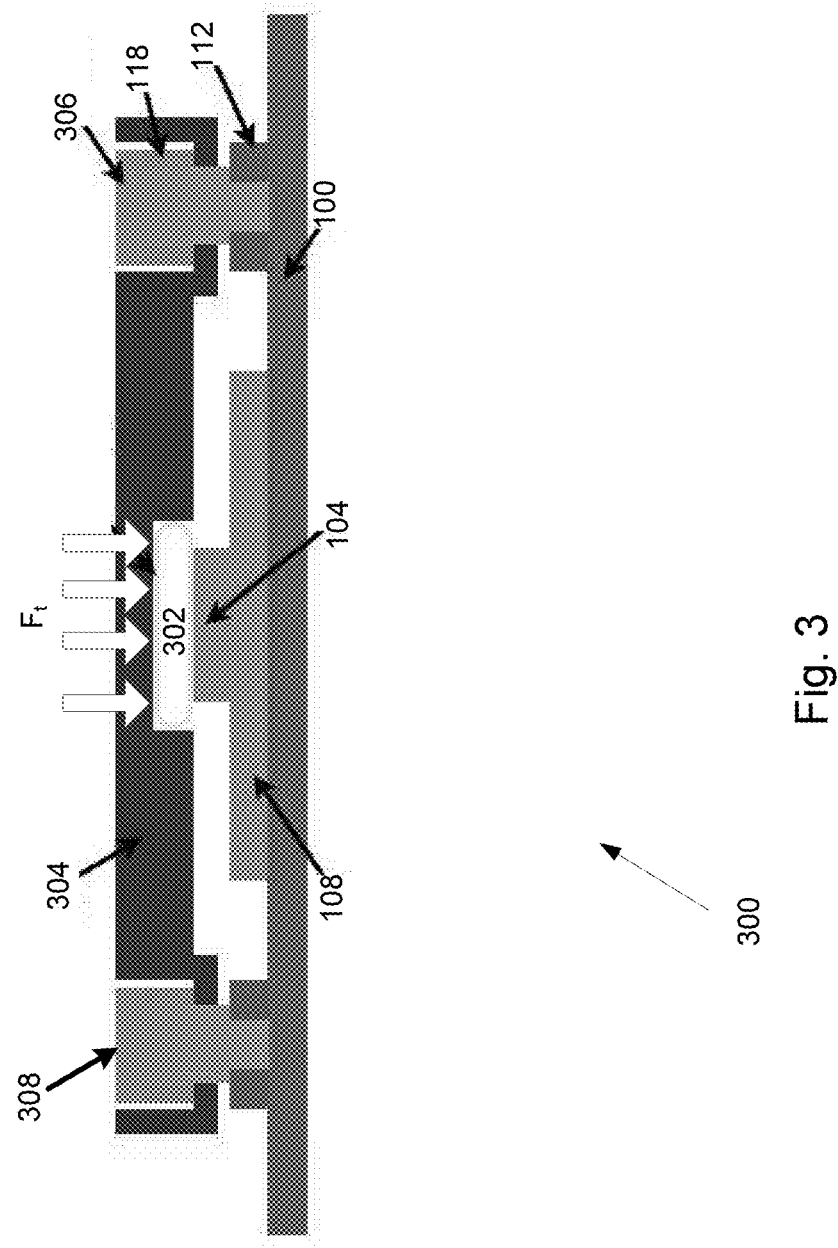
FIG. 3 shows heat removal system in accordance with the described embodiments.

FIG. 3 shows heat removal system 300 in accordance with the described embodiments. Heat removal system can include heat pipe 302 in direct thermal contact with processor die 104. By direct thermal contact it is meant that there is no intervening structure that contributes in a significant way to the thermal resistance of the thermal path between processor die 104 and heat pipe 302. In the described embodiment heat pipe 302 can have a height h of approximately 1 mm to about 2 mm, width w of approximately 8 mm to about 12 mm and a substantially constant wall thickness t of approximately 0.1 mm to about 0.3 mm. Stage 304 can be configured to substantially fully enclose heat pipe 302. In this way, any force $F_1$ applied by stage 304 by tightening screws 306 and 308, for example, can be evenly distributed across heat pipe 302 (i.e., avoiding the mechanical deflection caused by unbalanced applied forces $F_1$ and $F_2$) thereby improving the thermal coupling between processor die 104 and heat pipe 302.

In addition to reducing the overall part count, the absence of a slug or equivalent intervening structure can reduce the overall thickness of heat removal system 300. Moreover, by taking advantage of the additional space provided by the lack of a slug by increasing height h, heat pipe 302 can accommodate an increased volume of working fluid commensurate with the increase in height h. This increase in available working fluid can result in an increase in heat removed to the outside environment without substantially adding to the overall thickness of heat removal system 300. In this way, processor die 104 can generate more heat and yet operate at about the same, or lower temperatures. Since processing units (and integrated circuits in general) operate more efficiently at lower operating temperatures, the more efficient heat removal provided by system 300 enables processor die 104 to operate at a higher power level that can correspond to higher performance/speed.

Figure 4:
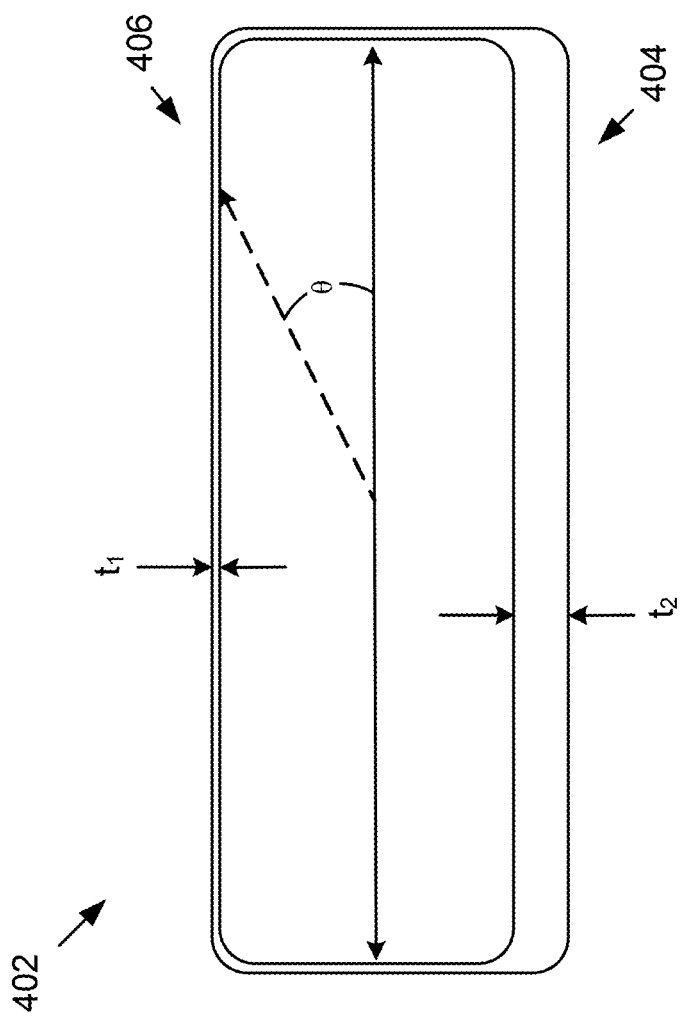
FIG. 4 shows a variable wall heat pipe in accordance with the described embodiments.

A variation of heat removal system 300 can be provided in which heat pipe 302 having a constant wall thickness t is replaced with heat pipe 402 having a variable wall thickness $t(\theta)$ shown in FIG. 4. By variable it is meant wall thickness t of heat pipe 402 depends on an angle ($\theta$). For example, portion 404 of heat pipe 404 that is part of the thermal interface with processor die 104 can have wall thickness $t_2$ greater than that the remaining portion 406 of heat pipe 402. For example, portion 404 can have an average thickness of approximately 0.5 mm whereas portion 406 can have an average thickness of about 0.2 mm. In this way, by preferentially providing a greater wall thickness only for that portion of the heat pipe in contact with the die, a more rugged heat pipe/die interface can be achieved without the need to increase the overall dimensions of the heat pipe as would be the case with a heat pipe having a constant wall thickness. In this way, providing a thick wall (and therefore a more rugged interface) only where needed, the impact on the Z stack height can reduced over that which would be required for a heat pipe having a constant wall thickness.

Figure 5:
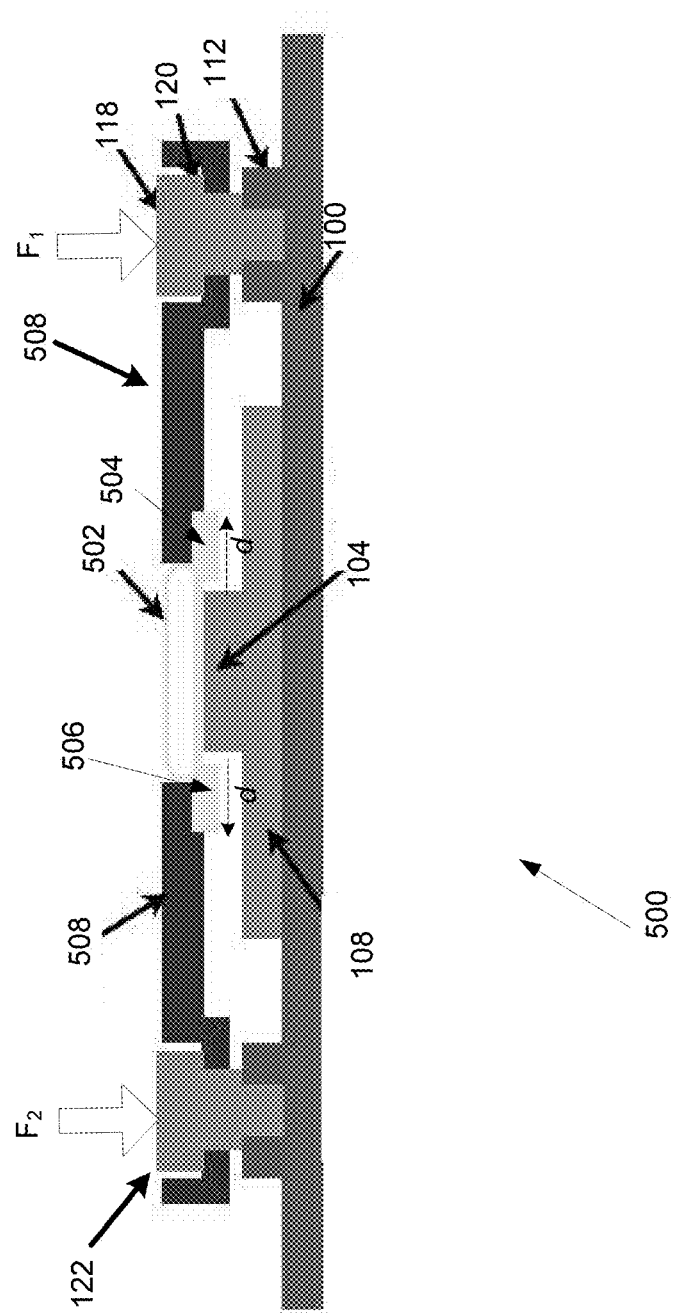
FIG. 5 illustrates heat removal system in accordance with another embodiment.

FIG. 5 illustrates heat removal system 500 in accordance with another embodiment. Heat removal system 500 includes heat pipe 502 and integrally formed lateral winglets 504 and 506 in combination with reduced thickness stage 508. In the described embodiment, winglets 504 and 506 can be formed as part of the heat pipe by, for example, forging, extrusion and so on. Winglets 504 and 506 can each be formed of the same or similar material as heat pipe 502. Heat pipe 502 can be in direct contact with processor die 104. In the embodiments shown in FIG. 5, lateral winglets 504 and 506 can extend out from heat pipe 502 approximately 2 mm. Moreover, lateral winglets 504 and 506 can take advantage of the region between processor die 104 and substrate 108 (referred to as the die/substrate terrace) by extending down approximately 0.5 mm measured from the upper surface of processor die 104. Lateral winglets 504 and 506 can also be configured in such as way as to form a shelf like supporting structure having an upper surface approximately flush with the upper surface of processor die 104. Winglets 504 and 506 can therefore provide support for stage 508 in such a way that stage 508 and heat pipe 502 are substantially flush with each other in that stage 508 does not appreciably extend above or over heat pipe 502. In this way, any incremental increase in height of the Z stack caused by heat removal system 500 can be essentially limited to no more than that of heat pipe 502. The mechanical coupling of stage 508 to winglets 504 and 506 effectively couples the heat transfer characteristics of the thermal path between processor die 104 and heat pipe 502 with the forces $F_1$ and $F_2$ generated by the tightening of screws 118 and 122.

Figure 6:
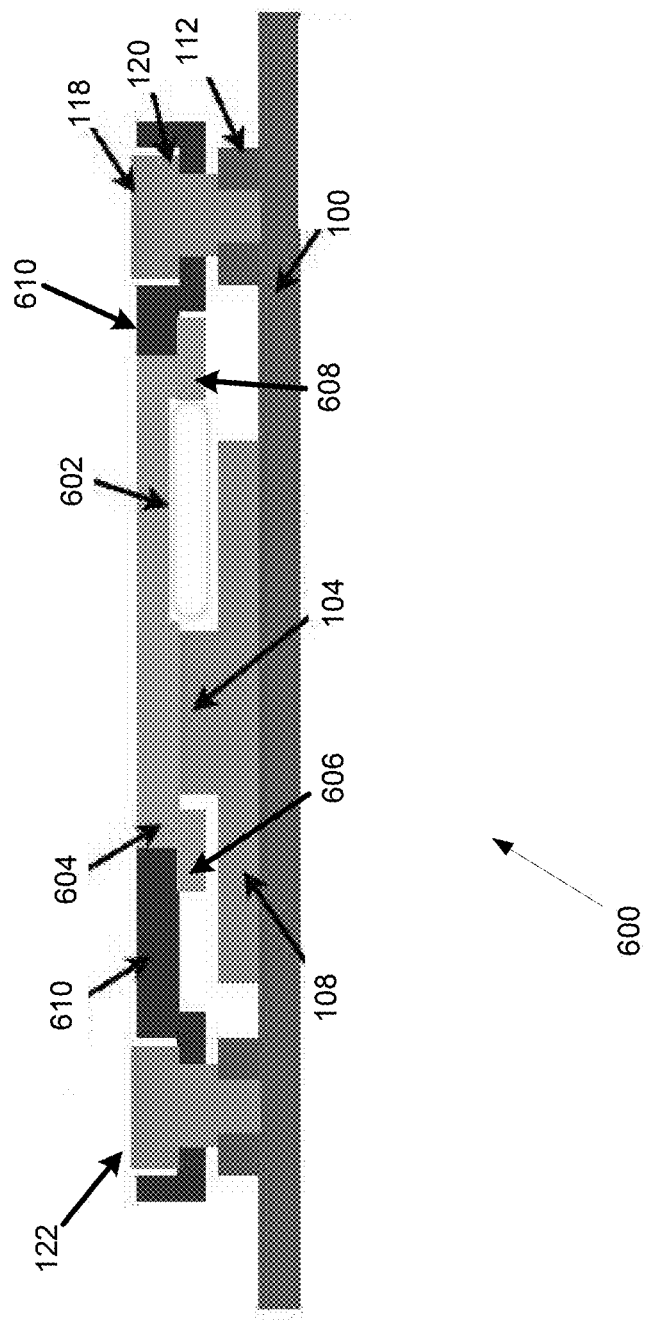
FIG. 6 illustrates heat removal system in accordance with the described embodiments.

FIG. 6 illustrates heat removal system 600 in accordance with the described embodiments. Heat removal system 600 can include heat pipe 602 lateral displaced to one side or the other of processor die 104. Heat removal system 600 can include slug 604 extended to overlay laterally placed heat pipe 602. Extended slug 604 can include lateral winglets 606 and 608. In the described embodiment, winglet 606 can take advantage of the die/substrate terrace to extend down from an upper surface of processor die 104 by approximately 0.5 mm. Winglet 608 can take advantage of laterally displaced heat pipe 602 to extend down from an upper surface of processor die 104 also by approximately 0.5 mm. Winglets 606 and 608 taken together can provide a structure on which reduced thickness stage 610 can be supported such that stage 610 can be made flush with slug 604.

Extended slug 604 can be part of a primary heat conduction path from processor die 104 to heat pipe 602. As a result, extended slug 604 can provide substantial resistance to the flow of heat from processor die 104 to heat pipe 602. In order to limit the adverse impact on the heat transfer capability of heat removal system 600, the choice of material for slug 604 should be one that is an intrinsically good conductor of heat, such as aluminum or copper. Moreover, the reduction in thermal efficiency caused by the slug/heat pipe interface can be mitigated to some extent by taking advantage of the lateral displacement of heat pipe 602 by increasing the size heat pipe 602. In so doing, the heat carrying capacity of heat pipe 602 can be commensurably increased thereby offsetting at least some of the reduced thermal efficiency attributable to extended slug 604.

Since a substantial portion of the flow of heat from processor die 104 to heat pipe 602 must be conducted laterally through extended slug 604, the overall thermal efficiency of heat removal system 600 can be reduced when compared with those systems where the heat pipe is placed above processor die 104. However, in spite of the reduced thermal efficiency, heat removal system 600 can be well suited for those situations (such as a thin laptop computer) that require a heat removal system that does not add significantly to the overall thickness of the Z stack of motherboard 100.

Figure 7:
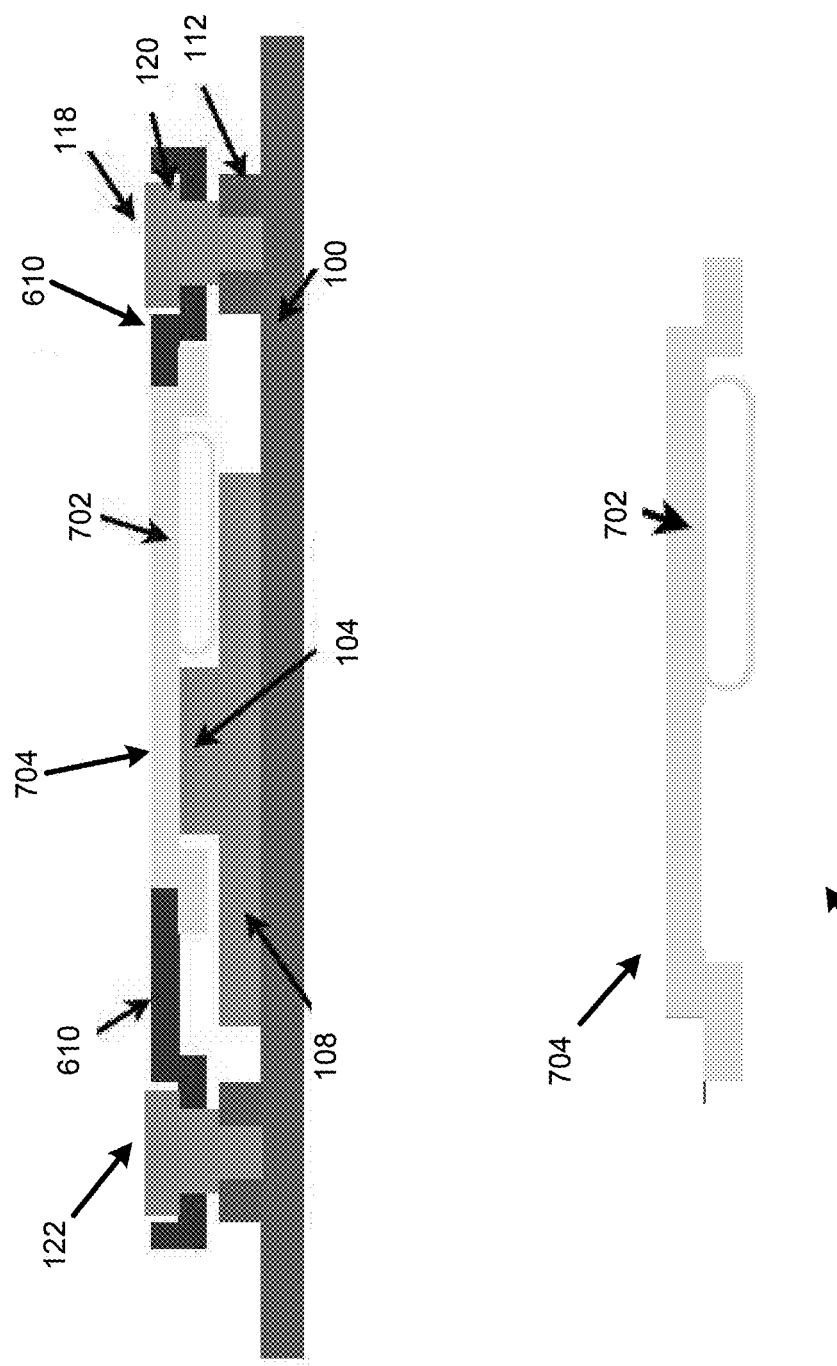
FIG. 7 shows a modification of heat removal system shown in FIG. 6 whereby extended slug is replaced by extended heat pipe.

FIG. 7 shows a modification of heat removal system 600 whereby extended slug 604 is replaced by extended heat pipe 700. Extended heat pipe 700 can include heat pipe 702 that can be placed at one side or the other of processor die 104.

Integrally formed with heat pipe 702, heat pipe extension 704 can replace extended slug 604. Since heat pipe extension 704 is an integral part of and is typically formed of the same material as heat pipe 702, heat pipe extension 704 can provide improved thermal transfer coupling between processor die 104 and heat pipe 702 over that provided by a discrete structure such as slug 604. Due in part to the improved thermal coupling, extended heat pipe 700 can be fabricated to have a thinner profile and yet retain the improved capacity to transfer heat from processor die 104 to heat pipe 702.

Figure 8:
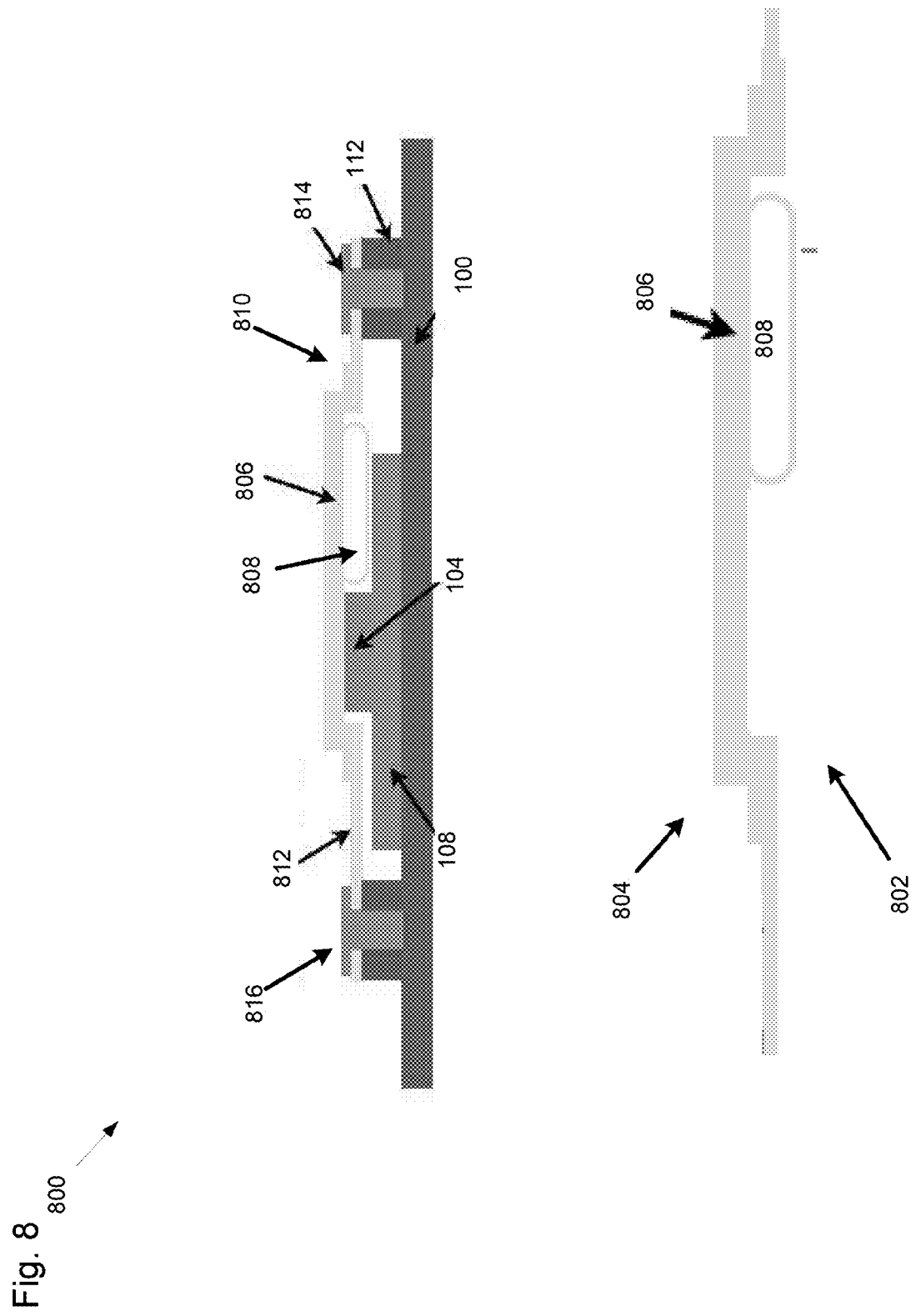
FIG. 8 illustrates heat removal system in accordance with another embodiment in which a number of components can be replaced with a single, integrated component.

FIG. 8 illustrates heat removal system 800 in accordance with another embodiment in which a number of components can be replaced with a single, integrated component. More specifically, springs 118 and 122 and any stage (or slug) component can be replaced with a single component 802 that can include flexible beam/spring structures 804 and rigid stage structure 806. In the described embodiment, the beam/spring structure 804 and the stage 806 can be integrally formed with heat pipe 808. Heat pipe 808 can be displaced laterally on one side or the other of die 104. Heat pipe 808 can a lower surface in contact with the die/substrate terrace region and an upper surface being an integral part of stage structure 806. In this way, any resistance to lateral heat transfer from die 104 to heat pipe 808 through stage 806 can be minimized. Integrated beam/spring structure 804 can include first portion 810 and second portion 812. First portion 810 can mechanically couple stage 806 to motherboard 100 by way of fastener 814. First portion 810 can be displaced down in relation to stage 806 by taking advantage of any space made available between stage 806 and motherboard 100 not already taken up by die 104, substrate 108, and heat pipe 808. In this way, fastener 814 can be commensurably reduced in length. Likewise, second portion 812 can take advantage of the die/substrate terrace by being displaced down an amount in keeping with portion 810. In this way fastener 816 can be about the same length as fastener 814. It should be noted that fasteners 814 and 816 can take the form of screws. In this way, screws 814 and 816 can be attached directly to stage 806/heat pipe 808 by way of first and second portions 810 and 812, respectively, thereby obviating the need for additional springs for screws 814 and 816. This arrangement provides reduced part count and minimum overall complexity yet retains both the improved thermal coupling and reduced Z profile.

Figure 9:
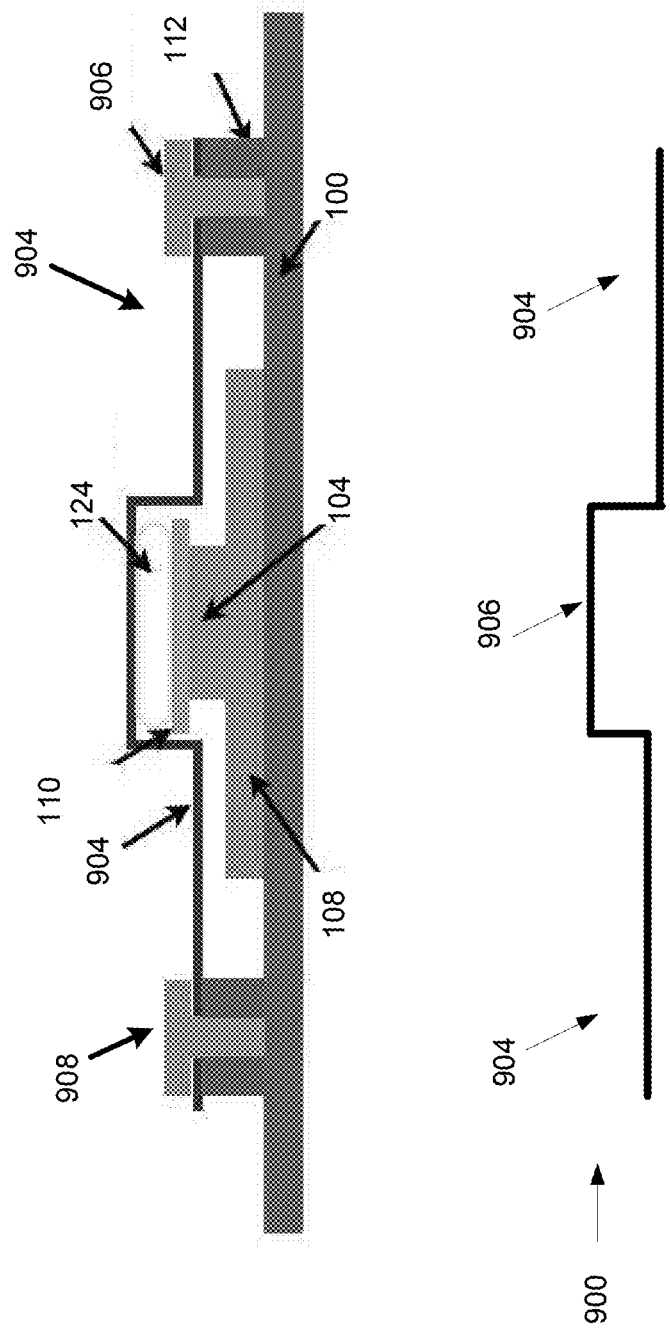
FIG. 9 shows beam spring unit 900 in accordance with the described embodiments.

FIG. 9 shows beam spring unit 900 that can be used in most heat removal system architectures to reduce parts count, improve thermal efficiency, and reduce Z impact. As seen in FIG. 9, beam spring unit 900 is similar to integrated beam/spring structure 802 in that beam spring 900 is a single structure that can integrate the functions previously provided by stage 806 and beam/spring structures 804. In particular, beam spring 900 has a substantially uniform thickness. Beam portions 902 and 904 can be used to mechanically couple stage portion 906 to motherboard 100 by way of fasteners. Advantageously, beam spring unit 900 can be used to modify at least any of previously described heat removal systems architectures singly or in any combination to optimize desired characteristics. For example, as shown in FIG. 9, beam spring unit 900 can be used to replace stage 116 shown in FIG. 2. This substitution can result in an overall reduction in thickness compared with the original design as well as a decoupling of pressure and thermal characteristics. It should be noted that in some embodiments the material that goes to form beam spring unit 900 can be chosen for functional needs not tied to heat transfer (strength, mass, thickness, etc). Furthermore, screws 118 and 120 can be replaced by shorter screws 906 and 908 and springs can be eliminated entirely. In this way, simply by using beam spring 900, the overall the cost, thermal efficiency, and impact on overall Z height can be substantially improved. It should be noted that further modifications can be made. For example, slug 110 can be eliminated without undue effort thereby improving the heat transfer properties. Still further, heat pipe 124 can be a variable wall thickness heat pipe or a constant wall thickness heat pipe.

Figure 10:
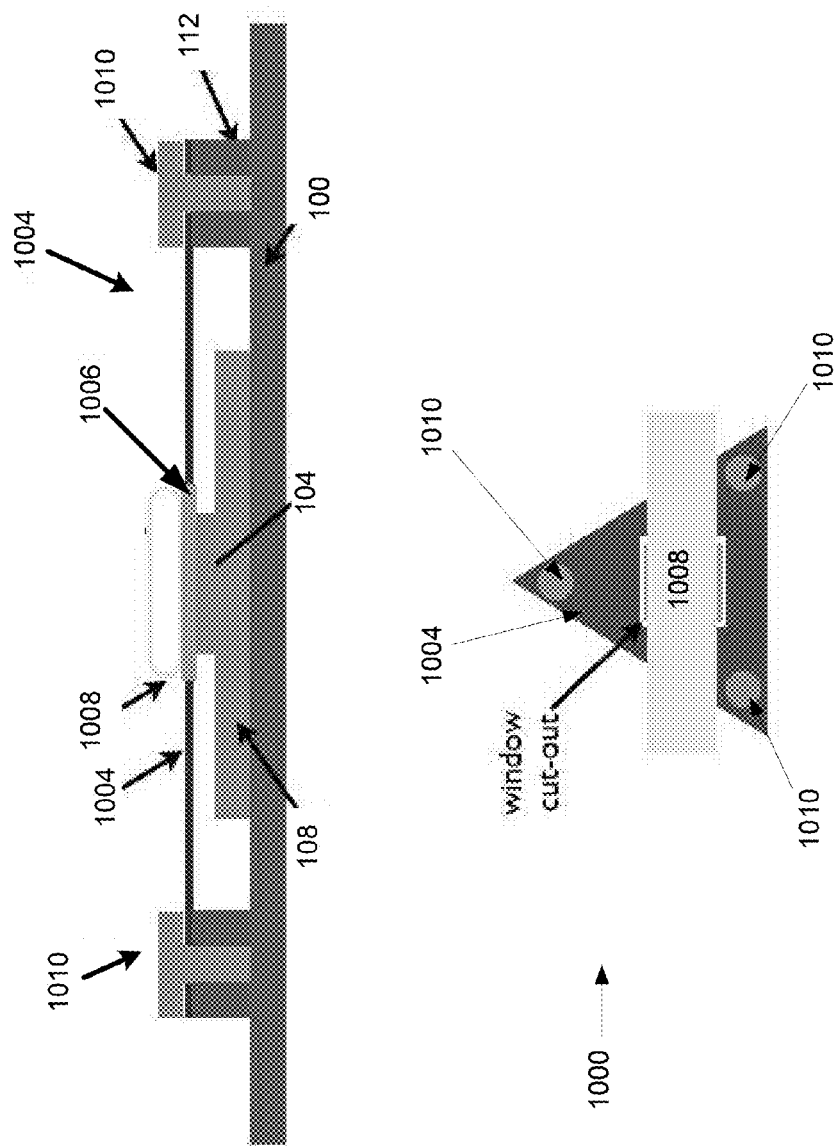
FIG. 10 shows windowed (beam/spring) structure in accordance with the described embodiments.

FIG. 10 shows windowed (beam/spring) structure 1002 in accordance with the described embodiments. Windowed structure 1002 can be formed by removing a portion of stage 1004 sufficient to accommodate slug 1006 on which heat pipe 1008 is in thermal and physical contact. Stage 1004 can be mechanically coupled to motherboard 100 by way of fasteners 1010. In the described embodiment, fasteners 1010 can take the form of screws and no springs. Therefore, in order to provide impact resistance, a spring or other such structure (not shown) must be attached, for solder for example, to heat pipe 1008. It should be noted that the design shown in FIG. 10 can be easily modified to suit the needs of the laptop manufacturer. For example slug 1006 can be removed with seriously affecting the overall design.

Figure 11:
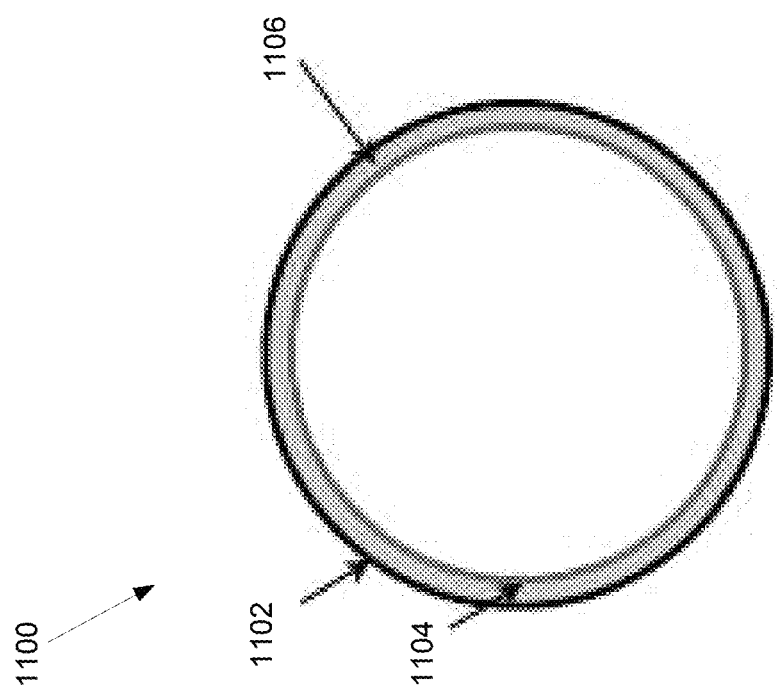
FIGS. 11 and 12 illustrate representative examples of composite heat pipes used in the formation of a heat removal system in accordance with the described embodiments.
Figure 12:
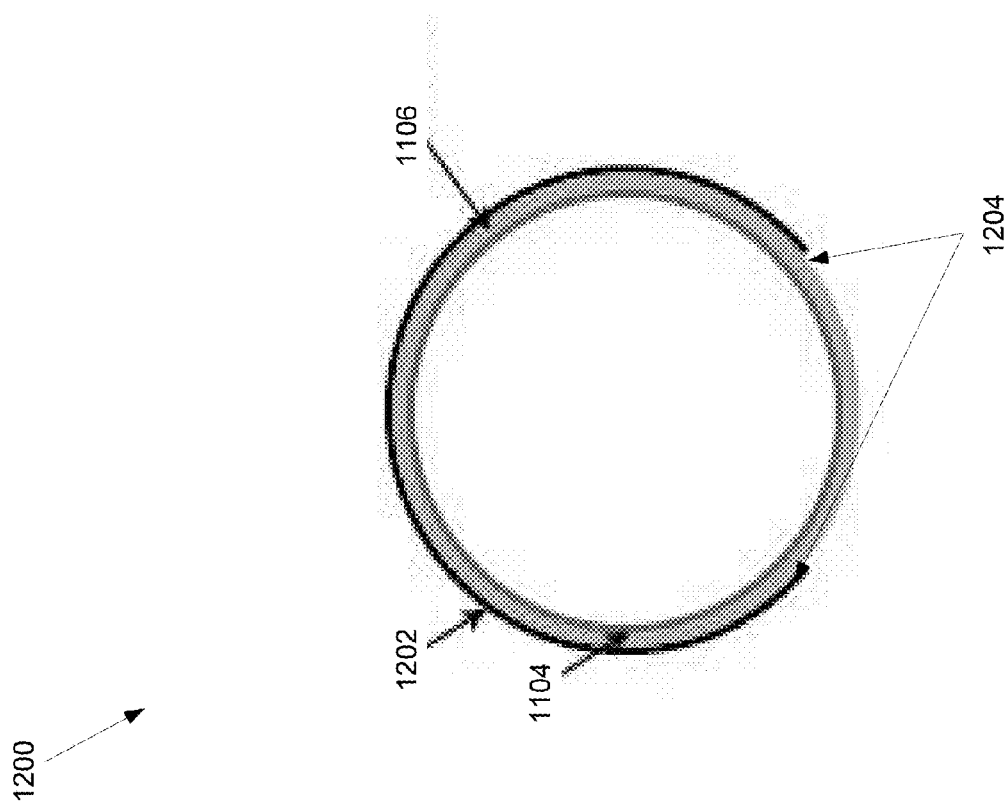

FIGS. 11 and 12 illustrate representative examples of improved conduits in the form of composite heat pipes used in the formation of a heat removal system. In particular, FIG. 11 shows composite heat pipe 1100. Composite heat pipe 1100 can include multiple layers of material. For example, composite heat pipe 1100 can include an outside layer 1102 located at an outside diameter (OD) of composite heat pipe 1100 formed of a first material and an inside layer 1104 located at an inside diameter (ID) formed of a second material. Between inside layer 1104 and outside layer 1102, body layer 1106 can be formed of a base material. In this way, base material mechanical properties can be de-coupled from inside second material chemical properties. By varying the materials, a manufacturer can provide a heat pipe that can more precisely serve the needs of a customer. For example, with the proper selection of materials, alternate working fluids can be used for a given base material (i.e., aluminum with water). In another example, complicated geometries can be created using alternative forming processes not easily available with conventionally configured heat pipes. In yet another example, the heat pipe manufacturer can provide lighter heat pipes by varying the compositions used in the manufacture and design of the heat pipe. It should be noted that composite heat pipe 1100 can be flattened along the lines discussed above.

Variations, such as those shown in FIG. 12, provides for a selective composite heat pipe 1200 that can be configured to have an outside surface having formed of a first material and a second material. In the embodiment shown, the first material is used primarily to form outer surface 1202 whereas base material can be taken as the second material by simply opening up a portion 1204 of outer surface 1202 to expose the desired amount of base material. In this way, heat transfer characteristics of composite heat pipe 1200 can be customized for specific applications. For example, radial heat transfer (either radiative or convective) can be adjusted in selected locations using specific first material on outside surface.

It should be noted that materials used in the manufacture of composite heat pipes 1100 and 1200, or any other embodiment, can be selected for various mechanical and or thermal properties. Such properties can include, for example, heat transfer characteristics, formability, solderability, environmental compatibility (corrosion etc.), weight, strength, electrical conductivity, thermal impedance at die interface, radiative properties, finishing options (etching for increased surface area etc), recyclability, cost, and so on.

While this invention has been described in terms of several preferred embodiments, there are alterations, permutations, and equivalents, which fall within the scope of this invention. It is therefore intended that the following appended claims be interpreted as including all such alterations, permutations, and equivalents as fall within the true spirit and scope of the present invention.

What is claimed is:

1. A low profile heat removal assembly, comprising:
an integrated circuit coupled with a surface of a printed circuit board (PCB), the integrated circuit extending a first distance from the surface of the PCB;
a slug that conducts heat from the integrated circuit to a heat pipe in thermal contact with a heat sink; and
a stage mechanically coupled with the PCB and configured to apply a force to the integrated circuit by way of the slug,
wherein at least a portion of the heat pipe is disposed within a region bound laterally by a periphery of the slug, wherein the region begins at the surface of the PCB and extends the first distance away from the surface of the PCB, and wherein the heat pipe is displaced laterally to one side of the integrated circuit.

2. The low profile heat removal assembly as recited in claim 1, wherein the stage further comprises a plurality of openings, each opening configured to accept a fastener that couples the stage to the PCB.

3. The low profile heat removal assembly as recited in claim 2, wherein the heat pipe is integrally formed with the slug.

4. The low profile heat removal assembly as recited in claim 2, wherein the heat pipe is homogenously formed with the slug.

5. The low profile heat removal assembly as recited in claim 2, wherein the heat pipe is homogenously formed with both the slug and the stage.

6. The low profile heat removal assembly as recited in claim 2, wherein the stage is mechanically coupled directly to the slug.

7. The low profile heat removal assembly as recited in claim 6, wherein each of the plurality of fasteners is a shoulder screw configured to interact with both a boss disposed on the PCB and a spring to exert a predefined amount of force on the stage.

8. The low profile heat removal assembly as recited in claim 1, wherein a top surface of the slug is substantially flush with a top surface of the stage.

9. A method for removing heat generated by an electrical component, the electrical component mounted to a substrate, the substrate mounted to a surface of a printed circuit board (PCB), the method comprising:
providing a slug in direct thermal contact with the electrical component;
providing a heat pipe that receives heat from the electrical component by way of the slug; and
applying a force to the electrical component through the slug by a stage, the stage comprising a fastener opening configured to accept a fastener that mechanically couples the stage to a surface of the PCB,
wherein at least a portion of the heat pipe is disposed within a region bound laterally by a periphery of the slug, wherein the region extends from the surface of the PCB to a height above the PCB no greater than a distance that the electrical component extends from the surface of the PCB and wherein the heat pipe is laterally displaced to one side of the electrical component.

10. The method as recited in claim 9, further comprising: using a heat exchanging medium carried by the heat pipe to transfer heat generated by the electrical component to an external heat sink in thermal contact with the heat pipe.

11. The method as recited in claim 10, wherein providing a slug in direct thermal contact with the electrical component comprises exerting force directly on at least one winglet portion of the slug such that a predefined amount of pressure is applied to the electrical component by way of the slug.

12. The method as recited in claim 11, wherein the fastener is a spring-loaded shoulder screw that provides the predefined amount of pressure to the electrical component, and wherein the electrical component is an integrated circuit.

13. An electronic device, comprising:
a printed circuit board (PCB);
an electrical component coupled with a surface of the PCB, the electrical component extending a first distance from the surface of the PCB;
a heat pipe configured to transfer heat generated by the electrical component to a heat sink in thermal contact with the heat pipe;
a slug that conducts the heat generated by the electrical component to the heat pipe;
a stage comprising a slug attachment feature configured to couple the stage to the slug; and
a plurality of fasteners securing the stage to the surface of the PCB,
wherein at least a portion of the heat pipe is disposed within a region bound laterally by a periphery of the slug, wherein the region begins at the surface of the PCB and extends the first distance away from the surface of the PCB, and wherein the heat pipe is displaced laterally to one side of the electrical component.

14. The electronic device as recited in claim 13, further comprising:
a substrate configured to couple the electrical component with the PCB; and
a plurality of bosses disposed proximate to the substrate and providing mounting points for the plurality of fasteners to be secured to the PCB.

15. The electronic device as recited in claim 14, wherein the electrical component and the heat pipe are about the same distance away from the surface of the PCB.

16. The electronic device as recited in claim 15, wherein a top surface of the slug is substantially flush with a top surface of the stage.

17. The electronic device as recited in claim 16, wherein the heat pipe is homogenously formed with the slug.

18. The electronic device as recited in claim 17, wherein the electronic device is a portable computer.

19. The electronic device as recited in claim 18, wherein the electrical component comprises an integrated circuit.

20. The electronic device as recited in claim 13, wherein the heat pipe is laterally displaced to one side or the other of the electrical component.

* * * * *